United States Patent
Lee et al.

[19]

[11] Patent Number: 6,165,863
[45] Date of Patent: Dec. 26, 2000

[54] ALUMINUM-FILLED SELF-ALIGNED TRENCH FOR STACKED CAPACITOR STRUCTURE AND METHODS

[75] Inventors: Ruojia Lee; Ralph Kauffman; J. Dennis Keller, all of Boise, Id.

[73] Assignee: Micron Technology, Inc., Boise, Id.

[21] Appl. No.: 09/102,331

[22] Filed: Jun. 22, 1998

[51] Int. Cl.[7] .................................................. H01L 21/20
[52] U.S. Cl. ........................... 438/387; 438/244; 438/655
[58] Field of Search ..................... 438/238, 625, 438/583, 52, 262, FOR 212, 243, 244, 386, 387

[56] References Cited

U.S. PATENT DOCUMENTS

| | | |
|---|---|---|
| 5,049,517 | 9/1991 | Liu et al. . |
| 5,061,650 | 10/1991 | Dennison et al. . |
| 5,142,438 | 8/1992 | Reinberg et al. ...................... 361/313 |
| 5,196,364 | 3/1993 | Fazan et al. . |
| 5,229,326 | 7/1993 | Dennison et al. . |
| 5,262,343 | 11/1993 | Rhodes et al. . |
| 5,270,241 | 12/1993 | Dennison et al. . |
| 5,338,700 | 8/1994 | Dennison et al. . |
| 5,374,579 | 12/1994 | Kuroda . |
| 5,498,562 | 3/1996 | Dennison et al. ........................ 437/52 |
| 5,563,089 | 10/1996 | Jost et al. . |
| 5,604,147 | 2/1997 | Fischer et al. . |
| 5,605,857 | 2/1997 | Jost et al. . |
| 5,609,511 | 3/1997 | Moriyama et al. . |
| 5,614,765 | 3/1997 | Avanzino et al. . |
| 5,635,423 | 6/1997 | Huang et al. . |
| 5,643,833 | 7/1997 | Tsukamoto . |
| 5,651,855 | 7/1997 | Dennison et al. . |
| 5,702,990 | 12/1997 | Jost et al. . |
| 5,705,838 | 1/1998 | Jost et al. . |
| 5,834,846 | 11/1998 | Shinriki et al. . |
| 6,001,729 | 12/1999 | Shinriki et al. ........................ 438/625 |

OTHER PUBLICATIONS

Tsukamoto, et al., 1997 Symposium on VLSI Technology Digest of Technical Papers ".25μm W–Polycide Dual Gate and Buried Metal on Diffusion Layer (BMD) Technology for DRAM–Embedded Logic Devices" pp. 23–24.

*Primary Examiner*—Matthew Smith
*Assistant Examiner*—Calvin Lee
*Attorney, Agent, or Firm*—Trask, Britt

[57] ABSTRACT

An aluminum interconnect which extends adjacent to and is insulated from a stacked capacitor structure to facilitate electrical communication between an active device region of a semiconductor substrate of a semiconductor device structure and a bit line extending above the semiconductor substrate. The aluminum interconnect is disposed within a trench and may include a metal silicide layer adjacent the active device region to form a buried metal diffusion layer. The aluminum interconnect may also include a metal nitride layer disposed between the metal silicide and aluminum. The invention also includes methods of fabricating aluminum interconnects adjacent stacked capacitor structures and semiconductor device structures which include the aluminum interconnects.

11 Claims, 8 Drawing Sheets

ALUMINUM-FILLED SELF-ALIGNED TRENCH FOR STACKED CAPACITOR STRUCTURE AND METHODS

BACKGROUND OF THE INVENTION

1. Field of the Invention

The present invention relates to stacked capacitor structures of semiconductor devices. In particular, the present invention relates to semiconductor device structures which include aluminum plugs disposed between the active device regions and bit lines thereof. More specifically, the present invention relates to semiconductor device structures which include an aluminum-filled trench that electrically connects a bit line to an active device region positioned between adjacent stacked capacitor structures.

2. Background of Related Art

Stacked capacitors are employed in many state of the art semiconductor devices to maintain high storage capacitance despite the ever-increasing densities of such semiconductor devices. Stacked capacitors typically make an electrical connection with a diffusion region, or active device region, of a semiconductor substrate, such as silicon, polysilicon, gallium arsenide, or indium phosphide. Some conventional processes for fabricating stacked capacitors on semiconductor device structures facilitate increased densities by employing electrically conductive layers (e.g., polysilicon layers) that are somewhat convoluted or have large surface areas, and which project outwardly relative to and electrically contact their associated active device regions. The remainders of the capacitor structures are then fabricated on the electrically conductive layers.

Many stacked capacitor structures include electrically conductive contacts between the active device regions and the bit lines thereof. Typically, such electrically conductive contacts are fabricated from polysilicon, which withstands the high temperature processes (e.g., thermal oxidation processes or thermal anneal processes) that are usually performed subsequent to the fabrication of contacts on semiconductor device structures. Such contacts, however, may create a somewhat undesirable amount of contact resistance during operation of the semiconductor device.

Metals have also been employed as the contact material between the active device region and bit lines of semiconductor devices and through the stacked capacitor structures thereof. Again, due to the high process temperatures that are employed following the fabrication of the contacts, metals that will withstand high process temperatures are typically employed in the contacts. Metals that will withstand such high process temperatures are commonly referred to as "refractory metals" and include titanium (Ti), tungsten (W), molybdenum (Mo), and tantalum (Ta). While these metals and their silicides have low resistivities relative to other metals, their resistivities ($\rho_{Ti}$=43–47 $\mu\Omega$-cm, $\rho_W$=5.3 $\mu\Omega$-cm, $\rho_{Mo}$=5 $\mu\Omega$-cm, $\rho_{Ta}$=13–16 $\mu\Omega$-cm) may be somewhat undesirable during the operation of state of the art very large scale integration (VLSI) and ultra large scale integration (ULSI) semiconductor devices. As metals of higher resistivity are employed in such semiconductor devices, the power requirements and operating temperature of such semiconductor devices increase undesirably.

Conventionally, aluminum (Al) has been widely employed as an electrically conductive material in semiconductor devices, as it has low resistivity ($\rho_{Al}$=2.7 $\mu\Omega$-cm) and is compatible with both silicon (Si) and silicon dioxide ($SiO_2$). Aluminum is not, however, typically employed in self-aligned processes due to its inability to withstand high temperature processing, such as the rapid thermal anneal processes that may be employed in fabricating self-aligned silicide layers.

What is needed is a process for fabricating a stacked capacitor structure on a semiconductor device structure which increases the speed of the semiconductor device and reduces the interconnect resistance and power consumption thereof and a stacked capacitor and semiconductor device structure fabricated by such a process.

SUMMARY OP THE INVENTION

The present invention includes a stacked capacitor structure and methods of fabricating the stacked capacitor structure which address the foregoing needs.

The stacked capacitor structure of the present invention includes a trench disposed over an active device region of a semiconductor device structure. The trench extends downward through the stacked capacitor structure to the active device region of the semiconductor substrate (e.g., silicon, gallium arsenide, indium phosphide), exposing same through the stacked capacitor structure. A layer of self-aligned metal silicide, or "salicide", is disposed within the trench, adjacent the active device region and preferably defining a buried metal diffusion (BMD) layer with the active device region. An aluminum interconnect, or "contact", is disposed within the trench in contact with the metal silicide and substantially filling the trench. The aluminum interconnect preferably provides an electrical link between the active device region and a bit line that extends above the stacked capacitor structure and electrically contacts the interconnect.

A method of fabricating a stacked capacitor structure is also within the scope of the present invention. The method includes fabricating a stacked capacitor structure over a semiconductor device structure and defining a trench through the stacked capacitor structure and over an active device region of the semiconductor device structure. Processes for fabricating stacked capacitor structures and defining trenches therethrough to an underlying active device region, which may be employed in the method of the present invention, are disclosed in U.S. Pat. No. 5,498,562 ("the '562 patent"), which issued to Dennison et al. on Mar. 12, 1996, the disclosure of which is hereby incorporated by reference in its entirety.

A layer of a metal that will form a salicide with the silicon exposed through the trench, such as titanium or tungsten, is then deposited over the semiconductor device structure. Known processes, such as rapid thermal anneal (RTA) or silicide deposition processes, may then be employed to form the salicide layer, such as titanium silicide ($TiSi_x$, predominantly $TiSi_2$) or tungsten silicide ($WSi_x$, predominantly $WSi_2$), which is typically referred to as a "selective" contact, over the active device region of the semiconductor device structure. The formation of silicides such as $TiSi_2$ and $WSi_2$ is said to be self-aligned since the silicide forms only over exposed semiconductor substrate (e.g., silicon and polysilicon) regions of a semiconductor device structure. Everywhere else, the metal film overlies an insulative, substantially non-reactive oxide layer, and may subsequently be removed. Preferably, the metal silicide diffuses into the silicon and defines a BMD layer. A metal nitride layer may also be fabricated over the selective contact by known techniques. Such metal nitride layers are typically referred to as "barrier" layers, as they prevent the diffusion of silicon and silicide into any metal layer or structure that is subsequently fabricated adjacent thereto.

An interconnect is fabricated in the trench by depositing aluminum over the semiconductor device structure in a manner that substantially fills the trench. Known processes, such as physical vapor deposition (PVD) and chemical vapor deposition (CVD) techniques, may be employed to deposit aluminum over the semiconductor device structure. The aluminum that covers other areas of the semiconductor device structure may then be removed by known processes, such as by known planarization (e.g., by chemical-mechanical polishing (CMP) techniques) or etching techniques, which do not remove aluminum from the trench. Additional layers and structures may then be fabricated or defined above the stacked capacitor, including, without limitation, bit lines that are in electrical contact with one or more corresponding aluminum interconnects.

Alternatively, portions of the aluminum layer that overlie the semiconductor device structure may be selectively removed therefrom by known techniques, such as masking and etching processes, in order to define bit lines that are integral with the aluminum interconnects and extend over an active surface of the semiconductor device structure. Such aluminum bit lines may be desirable since they may further reduce contact resistance and are compatible with the adjacent silicon dioxide of the semiconductor device structure.

The advantages of the present invention will become apparent to those of skill in the art through a consideration of the ensuing description, the accompanying drawings, and the appended claims.

DETAILED DESCRIPTION OF THE PREFERRED EMBODIMENTS

Figure 1:
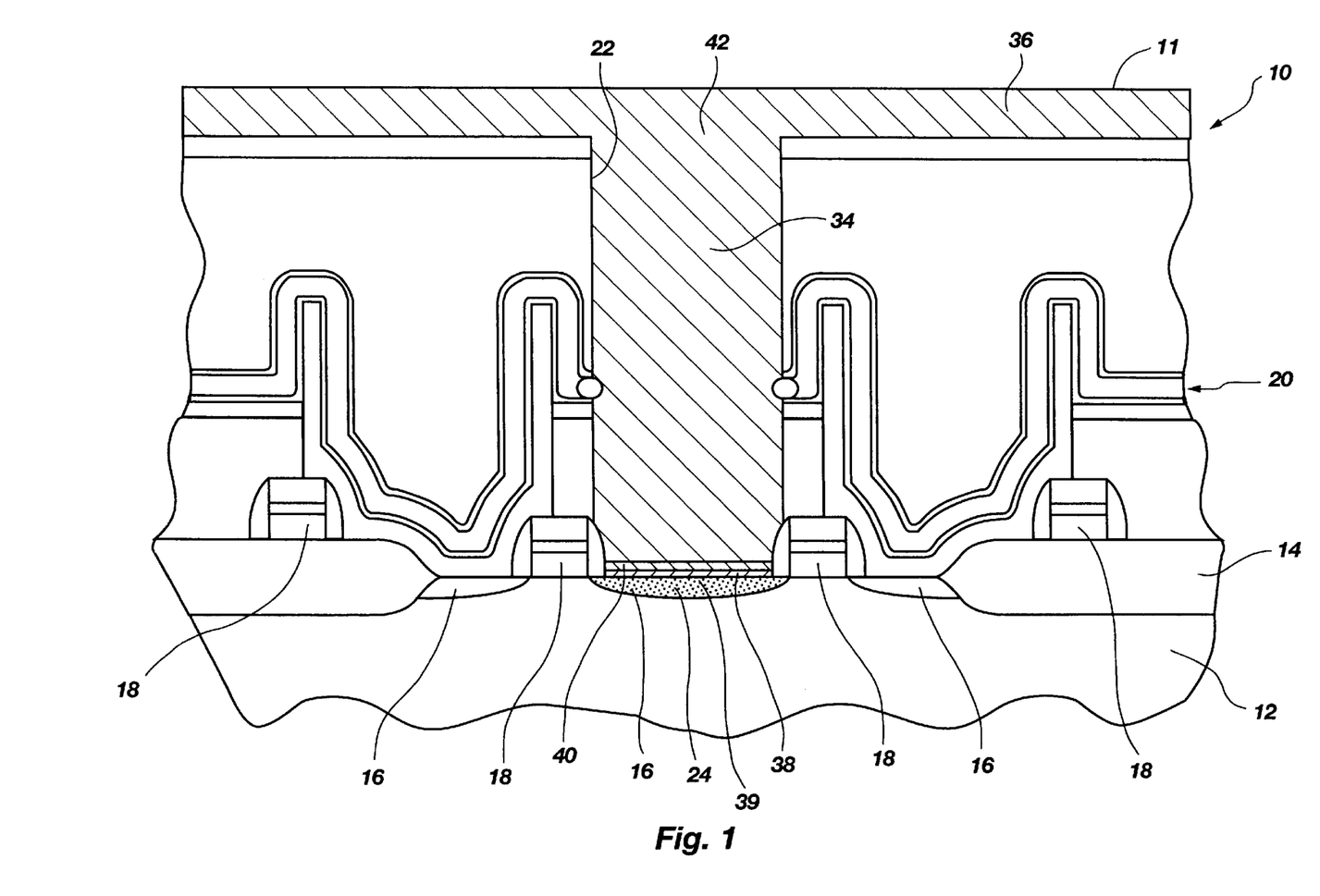
FIG. 1 is a cross-sectional schematic representation of a semiconductor device structure including an aluminum interconnect extending from an active device region of the semiconductor substrate and through a stacked capacitor structure to a bit line.

With reference to FIG. 1, a semiconductor device structure 10 according to the present invention is shown. Semiconductor device structure 10 includes a semiconductor substrate 12, such as silicon, gallium arsenide, or indium phosphide, a field oxide layer 14 disposed over various regions of semiconductor substrate 12, active device regions 16 in semiconductor substrate 12, word lines 18 extending over semiconductor substrate 12 and field oxide layer 14, and a stacked capacitor structure 20 disposed over word lines 18 and active device regions 16.

A trench 22 extends through stacked capacitor structure 20, exposing a source/drain 24, or p-n region, of active device region 16 to an active surface 11 of semiconductor device structure 10. A metal silicide selective contact 38 may be disposed over source/drain 24, and preferably defines a buried metal diffusion layer 39 in the semiconductor substrate 12 of source/drain 24. Selective contact 38 preferably comprises titanium silicide. A metal nitride layer 40, preferably titanium nitride (TiN), may be disposed over selective contact 38. The remainder of trench 22 is filled with aluminum, which defines an aluminum interconnect 34, or contact or plug.

Aluminum interconnect 34 is in electrical communication with a bit line 36 that extends over semiconductor device structure 10 above the stacked capacitor structures 20 thereof. Bit line 36 may be fabricated from an electrically conductive material, including, without limitation, metals such as aluminum, tungsten and titanium, electrically conductive polymers, and doped polysilicon. If bit line 36 is fabricated from aluminum, bit line 36 and aluminum interconnect 34 are preferably integral.

Figure 2:
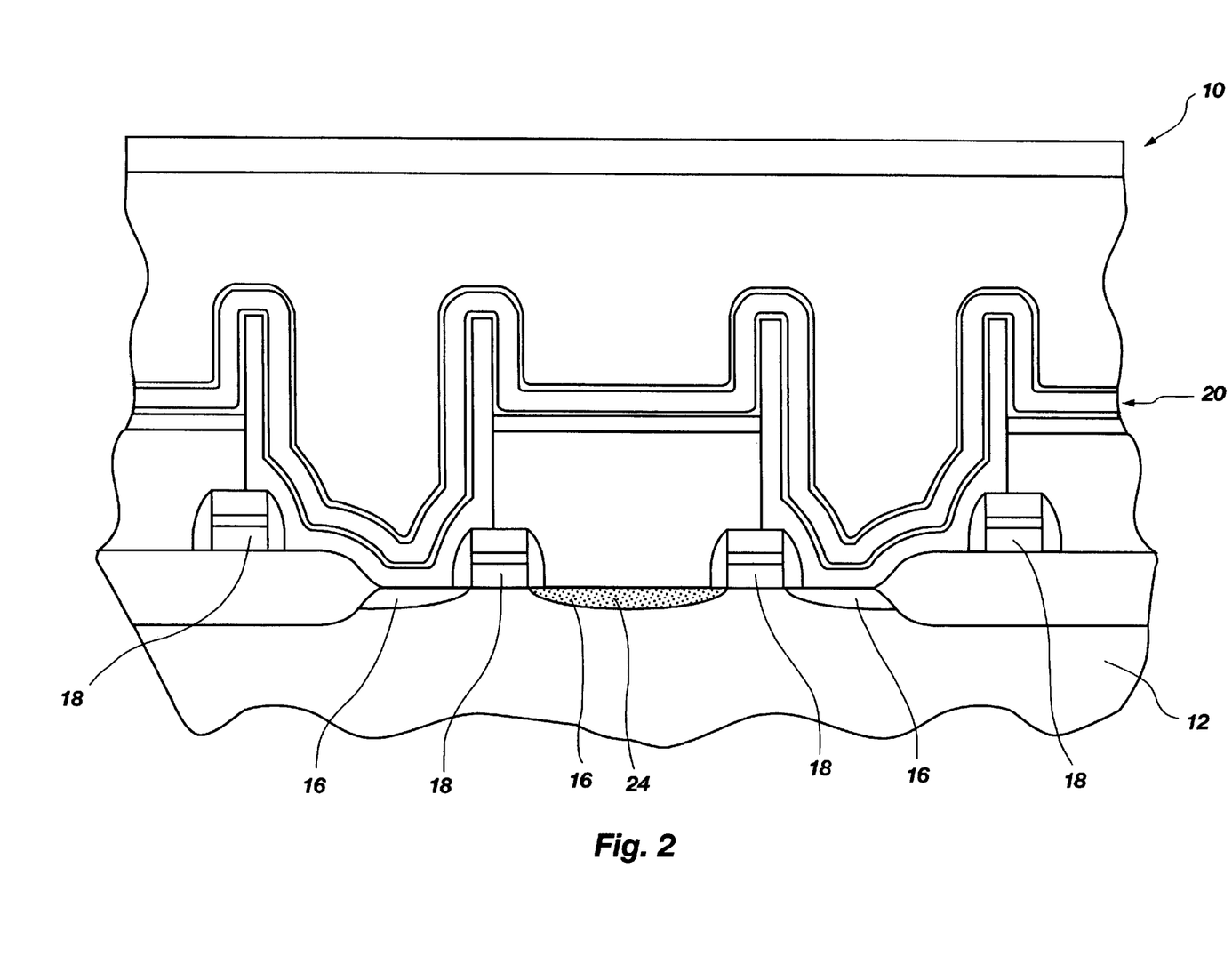
FIGS. 2–8 are cross-sectional schematic representations which illustrate a process of fabricating the semiconductor device structure of FIG. 1 in accordance with the present invention.

Referring now to FIGS. 2–8, a method of fabricating a semiconductor device structure 10 in accordance with the present invention is illustrated. FIG. 2 illustrates a semiconductor device structure 10 with active device regions 16, word lines 18, and a stacked capacitor structure 20 disposed thereon. Each of these features may be fabricated as known in the art, such as by the process disclosed in the '562 patent.

Figure 3:
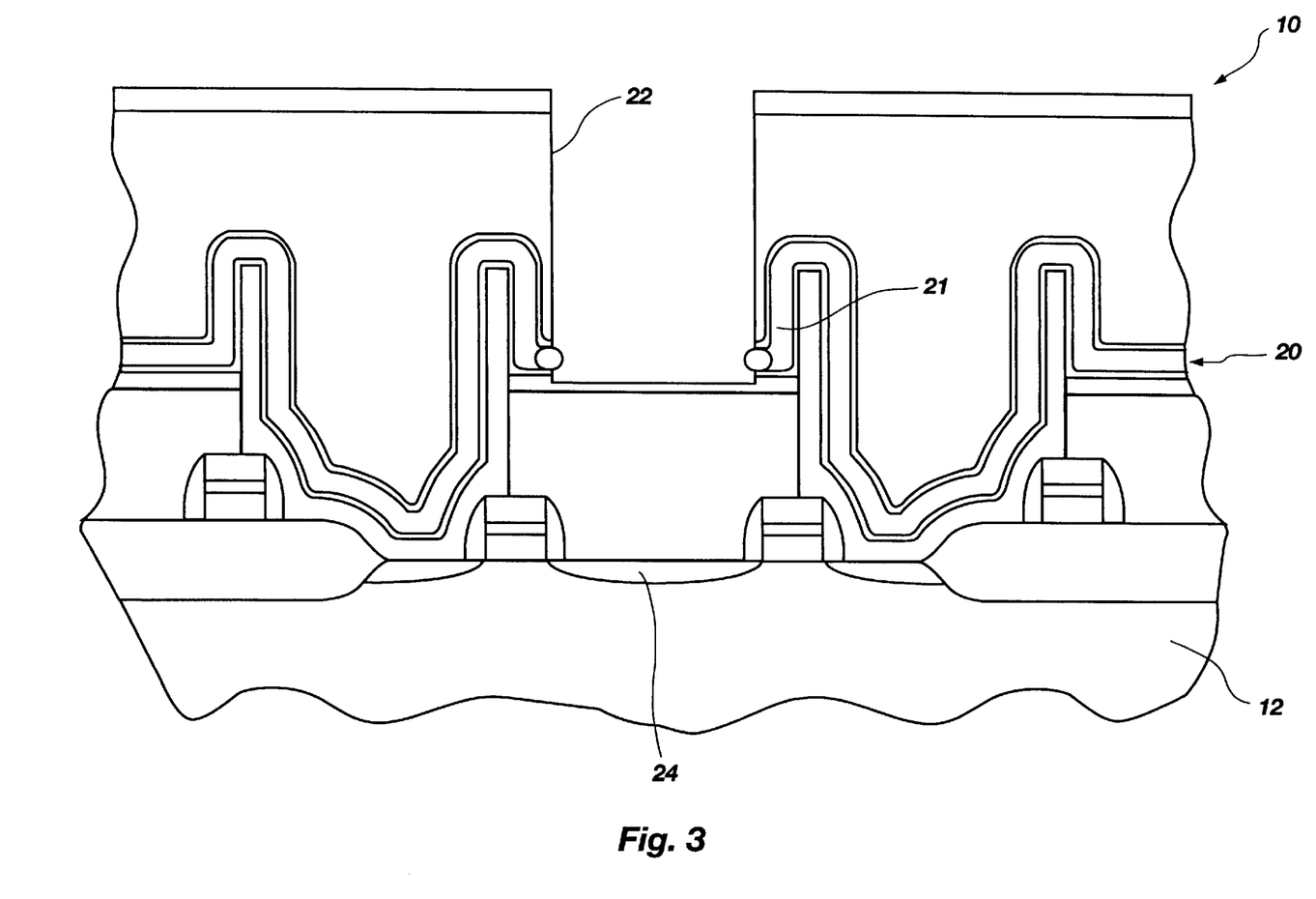

Turning now to FIG. 3, a trench 22 is defied through stacked capacitor structure 20 by known processes, such as the mask and anisotropic etch processes that are disclosed in the '562 patent. Any electrically conductive features of the stacked capacitor structure 20, such as the electrically conductive (typically polysilicon) layer 21 thereof, that are exposed to trench 22 may be oxidized by known processes to insulate these electrically conductive features from the subsequently fabricated aluminum interconnect 34 (see FIG. 1), as disclosed in the '562 patent. Preferably, in order to prevent oxidation of source/drain 24 as any exposed electrically conductive features of stacked capacitor structure 20 are insulated, such insulation is performed before trench 22 has been completely defined and, therefore, prior to the exposure of source/drain 24 through trench 22.

Figure 4:
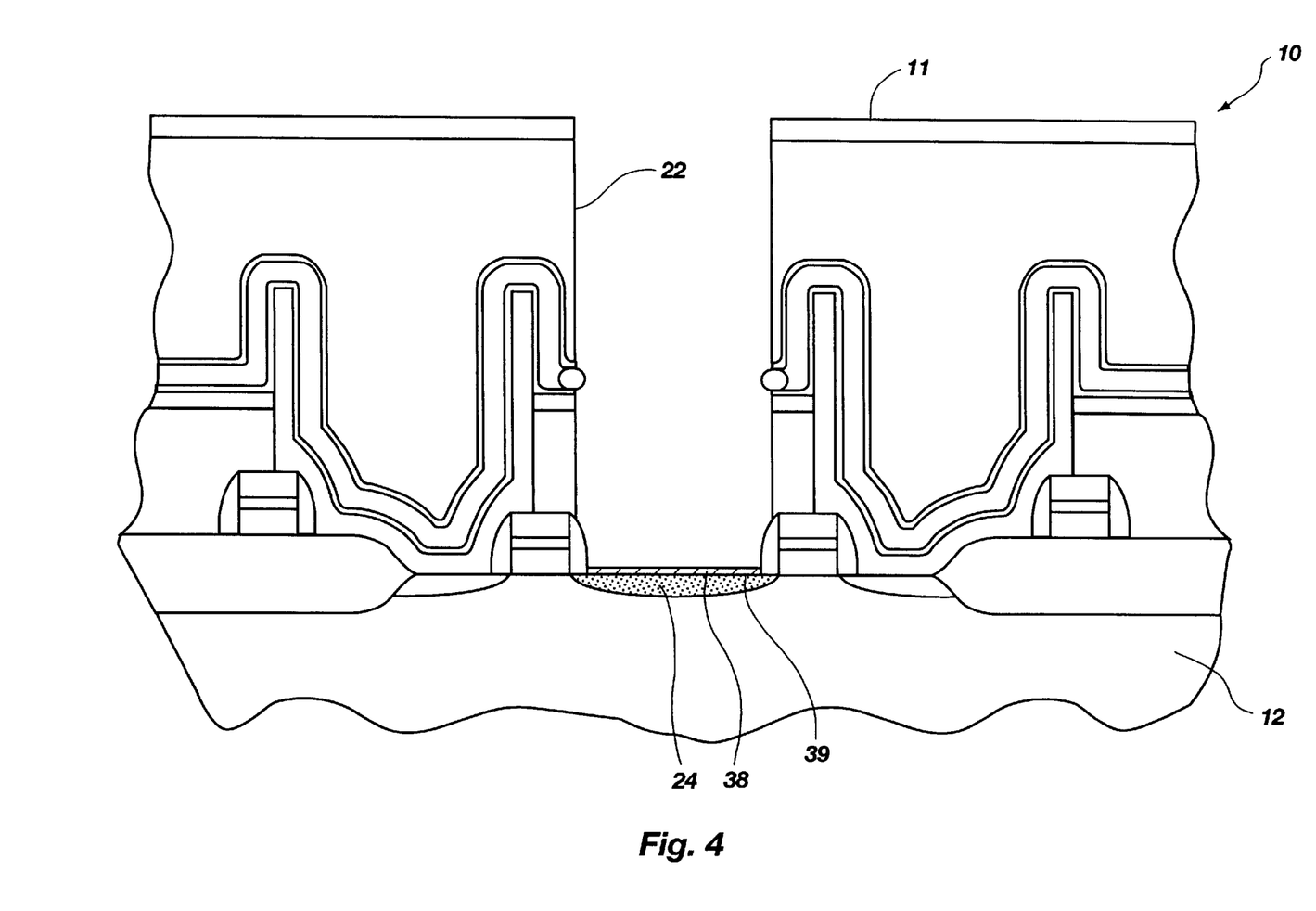

With reference to FIG. 4, a selective contact 38 of a metal silicide may then be fabricated over source/drain 24. Metal silicides that may be employed as selective contact 38 include, without limitation, titanium silicide (TiSi$_x$, predominantly TiSi$_2$), tungsten silicide (WSi$_x$, predominantly WSi$_2$), molybdenum silicide (MoSi$_x$, predominantly MoSi$_2$), and platinum silicide (PtSi$_x$, predominantly PtSi$_2$). Known processes may be employed to form selective contact 38. An exemplary process for fabricating selective contact 38 includes the deposition of a metal or metal nitride over semiconductor device structure 10, a rapid thermal anneal of the metal or metal nitride to the exposed regions of semiconductor substrate 12 to form the salicide selective contact 38, and removal of the non-reacted metal or metal nitride from the active surface 11 of the semiconductor device structure 10.

Alternatively, selective contact 38 may be selectively deposited onto source/drain 24 by chemical vapor deposition (CVD) of a metallic precursor and a silicon-containing compound. For example, when titanium silicide selective contacts are desired, a titanium tetrahalide, such as titanium tetrachloride (TiCi$_4$), is reacted with either silane (SiH$_4$) or dichlorosilane (DCS, SiH$_2$Cl$_2$) as follows:

$TiCl_4 + SiH_4 \rightarrow TiSi_2 \downarrow$ $TiCl_4 + SiH_2Cl_2 \rightarrow TiSi_2 \downarrow$ In order to optimize the selectivity of these titanium silicide deposition reactions for the semiconductor substrate 12, which is exposed through trench 22, a deposition temperature in the range of about 650° C. to about 750° C. is preferable. Since minimal amounts of the semiconductor substrate 12 are consumed by these reactions, the deposition reaction is allowed to continue until a selective contact 38 of the desired thickness is formed.

Other exemplary metal silicide deposition processes that may be employed in the present invention to fabricate selective contact 38 include the reaction of a titanium halide and/or a gaseous titanium organometallic precursor with a silicon-containing compound of the formula $Si_nH_{2n+2}$, as disclosed in U.S. Pat. No. 5,240,739, issued to Trung Doan et al. on Aug. 31, 1993; U.S. Pat. No. 5,278,100, issued to Trung Doan et al. on Jan. 11, 1994; and U.S. Pat. No. 5,376,405, issued to Trung Doan et al. on Dec. 27, 1994, the disclosures of each of which are hereby incorporated by reference in their entirety. Titanium halides that may be employed in the deposition of selective contact 38 over source/drain 24 include, without limitation, $TiCl_4$, titanium tetraboride, titanium tetrafluoride, titanium tetraiodide, and subhalides. Titanium organometallic precursors which may be used to fabricate selective contact 38 include, but are not limited to compounds of the formula $Ti(NR_2)_4$, where the titanium atom is bonded to, the nitrogen atom and R comprises hydrogen or a carbon-containing radical. Exemplary compounds include tetradimethylamido titanium (TDMAT or $Ti(N(CH_3)_2)_4$ and $Ti(N(C_2H_5)_2)_4$).

The following are exemplary chemical reactions for depositing metal silicide on source/drain 24:

$nTiCl_4+Si_nH_{2n+2} \rightarrow nTiSi+4nHCl+H_2+\text{by-products}$;
$nTiCl_4+2Si_nH_{2n+2} \rightarrow nTiSi+4nHCl+2H_2+\text{by-products}$;
$TiCi_4+Si_nH_{2n+2} \rightarrow Ti_5Si_3+HCl+H_2+\text{by-products}$;
$TDMAT+Si_2H_6 \rightarrow TiSi_2+\text{organic by-products}$;
$TDMAT+Si_nH_{2n+2} \rightarrow (n/2)TiSi_2+\text{organic by-products}$; and
$Ti(NR_2)_4+SiH_4 \rightarrow TiSi_x+TiSi_yN_{1-y}+\text{organic by-products}$, where x is predominantly equal to two, y is zero or one and n is an integer equal to zero or more. The reaction between $TiCl_4$ and $Si_2H_6$ may be employed to deposit selective contact 38 over source/drain 24 at a temperature as low as about 400° C. The reaction of $TiCl_4$ and $Si_3H_8$ deposits a titanium silicide selective contact 38 on a semiconductor substrate at a temperature of about 300° C. or higher.

Preferably, selective contact 38 and semiconductor substrate 12 diffuse into each other to define a buried metal diffusion layer 39.

Although silicide deposition in accordance with the foregoing processes is selective for semiconductor substrate 12, residual metal silicide may be deposited above stacked capacitor structure 20. Thus, cleaning of semiconductor device structure 10 may be desirable in order to remove any residual metal silicide from above stacked capacitor structure 20. Cleaning agents such as chlorine ($Cl_2$), hydrochloric acid (HCl) and hydrofluoric acid (HF) may be employed in known cleaning techniques (e.g., thermal gas, plasma assisted, and remote plasma activated cleaning) to clean any residual metal silicides from field oxide layer 14.

Figure 5:
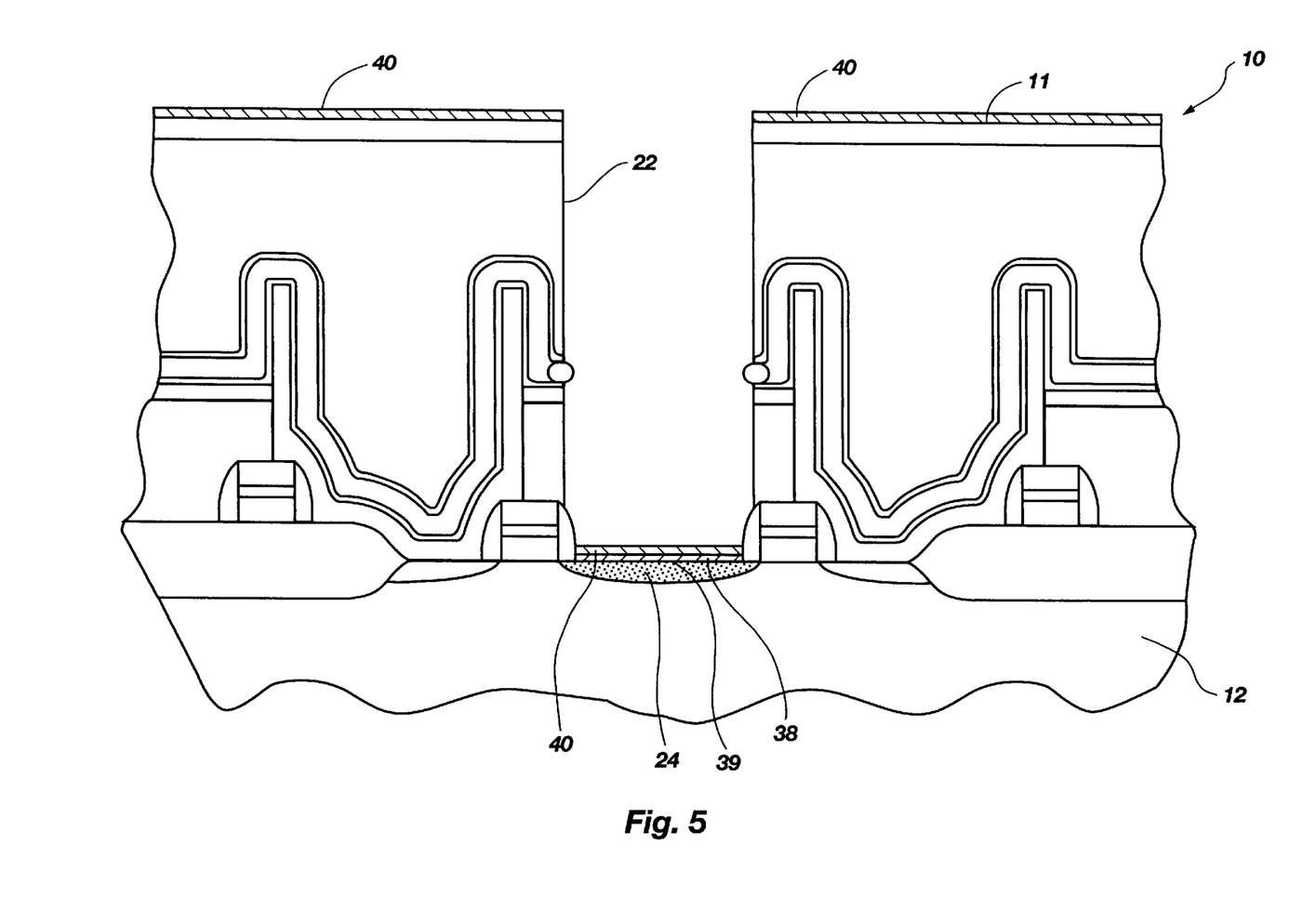

Referring now to FIG. 5, upon depositing a selective contact 38 of the desired thickness, a metal nitride layer 40, which is also referred to as a barrier layer, may be deposited over selective contact 38. A metallic precursor and another reactant, which are collectively referred to as second reactants, may be reacted to deposit metal nitride layer 40 over semiconductor device structure 10. The metallic precursor, which is preferably $TiCl_4$ when selective contact 38 is comprised of titanium silicide, is reacted with ammonia ($NH_3$) to initiate the following chemical reaction, which deposits a metal nitride layer 40 of titanium nitride over the surface of semiconductor device structure 10:

$TiCl_4+NH_3 \rightarrow TiN \downarrow$, including above the stacked capacitor structures 20 and selective contacts 38 of the semiconductor device structure 10 (i.e., a "blanket" deposition occurs). The duration of the foregoing reaction is dependent upon the desired thickness of metal nitride layer 40. This reaction may also be carried out in the presence of nitrogen gas ($N_2$), as discussed in U.S. Pat. No. 5,416,045 ("the '045 patent"), issued to Ralph E. Kauffman et al. on May 16, 1995, the disclosure of which is hereby incorporated by reference in its entirety. As explained in the '045 patent, nitrogen gas facilitates the deposition of titanium nitride at temperatures of about 500° C. or lower. Hydrogen gas ($H_2$) may also be introduced into the reaction chamber to facilitate the formation of hydrochloric acid from chlorine.

Other chemical reactions are also useful for depositing metal nitride layer 40. U.S. Pat. No. 5,399,379 ("the '379 patent"), issued to Gurtej S. Sandhu on Mar. 21, 1995, the disclosure of which is hereby incorporated by reference in its entirety, describes such a reaction, whereby one or more organometallic compounds of the formula $Ti(NR_2)_4$, which is also referred to as a tetrakis-dialkylamido-titanium, are reacted with a halide gas (e.g., $F_2$, $Cl_2$, $Br_2$) to form a titanium nitride film on a semiconductor device. In each $Ti(NR_2)_4$ molecule, the titanium atom is single-bonded to four nitrogen atoms, each of which are also single-bonded to two carbon-containing radical (R) groups, which include hydrogen atoms or alkyl groups.

Another exemplary titanium nitride deposition reaction is disclosed in U.S. Pat. No. 5,254,499 ("the '499 patent"), issued to Gurtej S. Sandhu et al. on Oct. 19, 1993, the disclosure of which is hereby incorporated by reference in its entirety. According to the '499 patent, a titanium nitride layer may also be deposited by reacting one or more compounds of the general formula $Ti(NR_2)_4$, where the titanium atom is bonded to a nitrogen atom, which is in turn bonded to two hydrogen atoms or a carbon-containing radical (R), with ammonia ($NH_3$). The following United States Patents disclose various other methods for depositing titanium nitride films, wherein the second reactants are $Ti(NR_2)_4$ and ammonia: U.S. Pat. No. 5,192,589, issued to Gurtej S. Sandhu on Mar. 9, 1993; U.S. Pat. No. 5,139,825, issued to Roy G. Gordon et al. on Aug. 18, 1992; and U.S. Pat. No. 5,089,438, issued to Avishay Katz on Feb. 18, 1992, the disclosures of each of which are hereby incorporated by reference in their entirety.

U.S. Pat. No. 5,246,881, issued to Gurtej S. Sandhu et al. on Sep. 21, 1993, the disclosure of which is hereby incorporated by reference in its entirety, discloses another method for depositing a titanium nitride film, wherein the second reactants are one or more compounds of the formula $Ti(NR_2)_4$, where the titanium atom is bonded to the nitrogen atom which is, in turn, bonded to two hydrogen atoms or a carbon-containing radical (R), and an activated species which attacks the R-nitrogen bonds of the $Ti(NR_2)_4$, and which will convert the activated species to a volatile compound. The activated species include halogens, ammonia, and hydrogen, and are radiofrequency (RF) activated remote from the $Ti(NR_2)_4$.

Another titanium nitride deposition reaction that is useful in the method of the present invention is disclosed in U.S. Pat. No. 5,227,334, issued to Gurtej S. Sandhu on Jul. 13, 1993, which is hereby incorporated by reference in its entirety. The second reactants of that process include a titanium-containing compound, such as $Ti(NR_2)_4$, and nitrogen trifluoride ($NF_3$).

Alternatively, metal nitride layer 40 may comprise a mixed phase layer, such as the $TiN/TiSi_x$ layer deposited by the method disclosed in U.S. Pat. No. 5,525,518 ("the '518 patent"), issued to Gurtej S. Sandhu et al. on Oct. 12, 1993, the disclosure of which is hereby incorporated by reference in its entirety. The process of the '518 patent includes reacting $Ti(NR_2)_4$, where the titanium atom is bonded to the nitrogen atom which is, in turn, bonded to two hydrogen atoms or a carbon-containing radical (R), with an organic silane reactive gas, such as tris(dimethylamino) silane (SIN).

Figure 6:
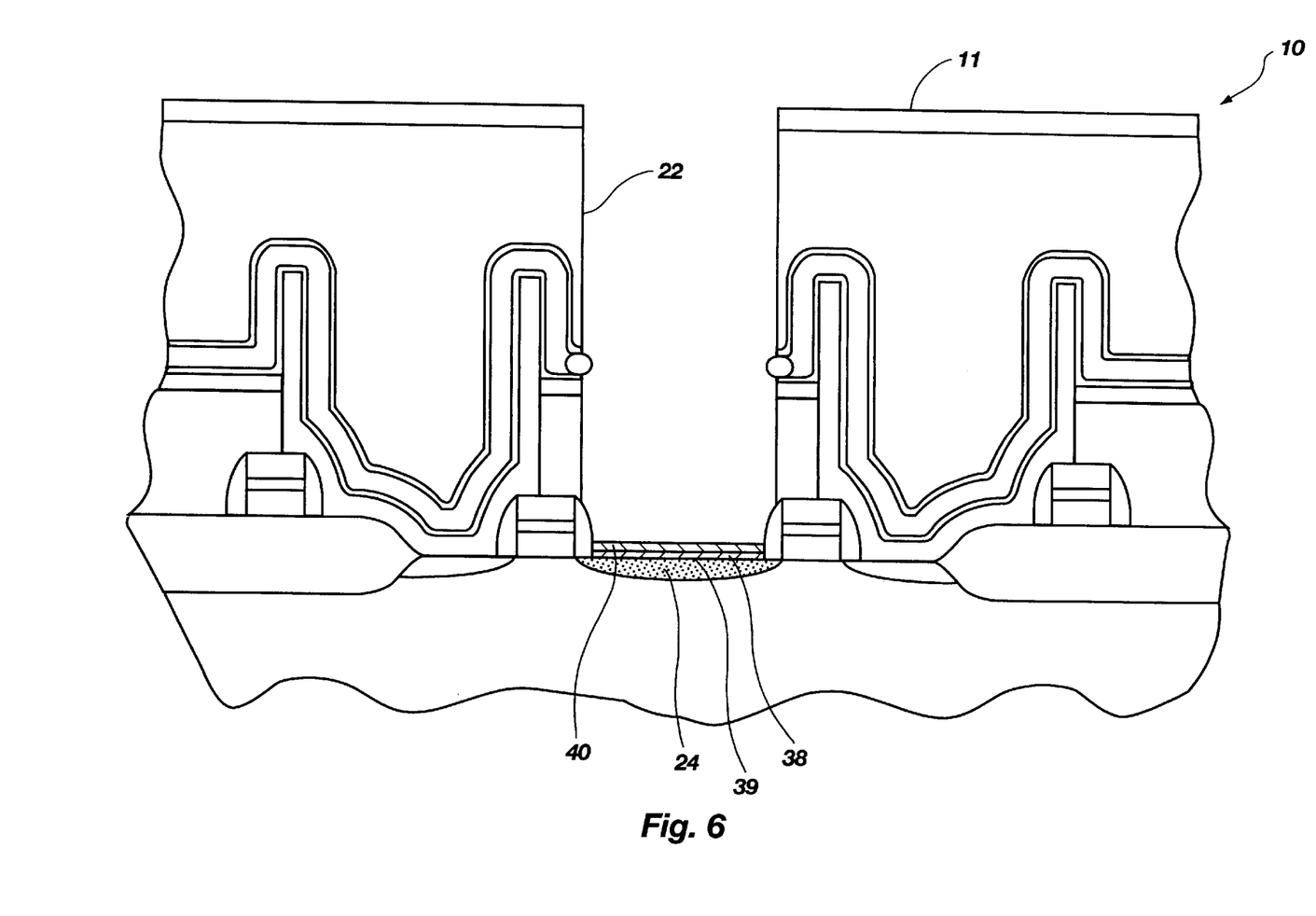

FIG. 6 illustrates the selective removal of metal nitride layer 40 from the active surface 11 of semiconductor device structure 10. Known patterning processes, such as mask and etch techniques, may be employed to selectively remove metal nitride layer 40 from various regions of the semiconductor device structure (e.g., from above the stacked capacitor structures 20 thereof), while metal nitride layer 40 remains over selective contact 38. Alternatively, a layer 42 (see FIG. 7) of aluminum may be disposed over metal nitride layer 40 prior to such patterning.

Figure 7:
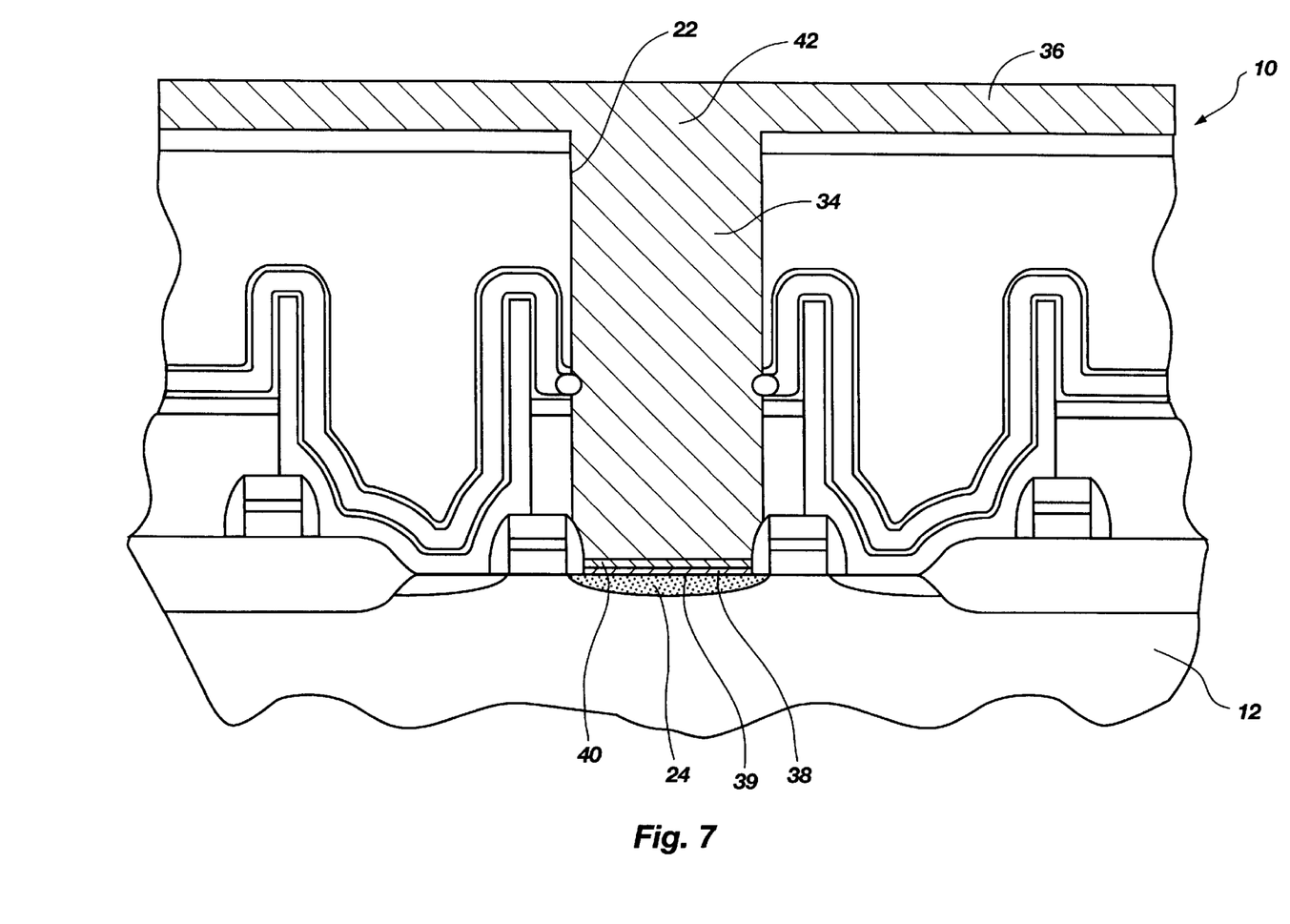

With reference to FIG. 7, a layer 42 of aluminum may be disposed over semiconductor device structure 10 and within trench 22 by known processes, such as PVD (e.g., sputtering, evaporation, or other PVD processes) or CVD. Aluminum layer 42 may be patterned by known techniques, such as masking and etching, to define bit lines 36 (see FIG. 1) therefrom and integral therewith. Alternatively, the layer 42 of aluminum overlying semiconductor device structure 10 may be substantially completely removed from above the stacked capacitor structures 20 thereof by known techniques, such as etch processes or planarization processes (e.g., chemical/mechanical planarization (CMP)) that will leave aluminum interconnect 34 substantially intact.

Figure 8:
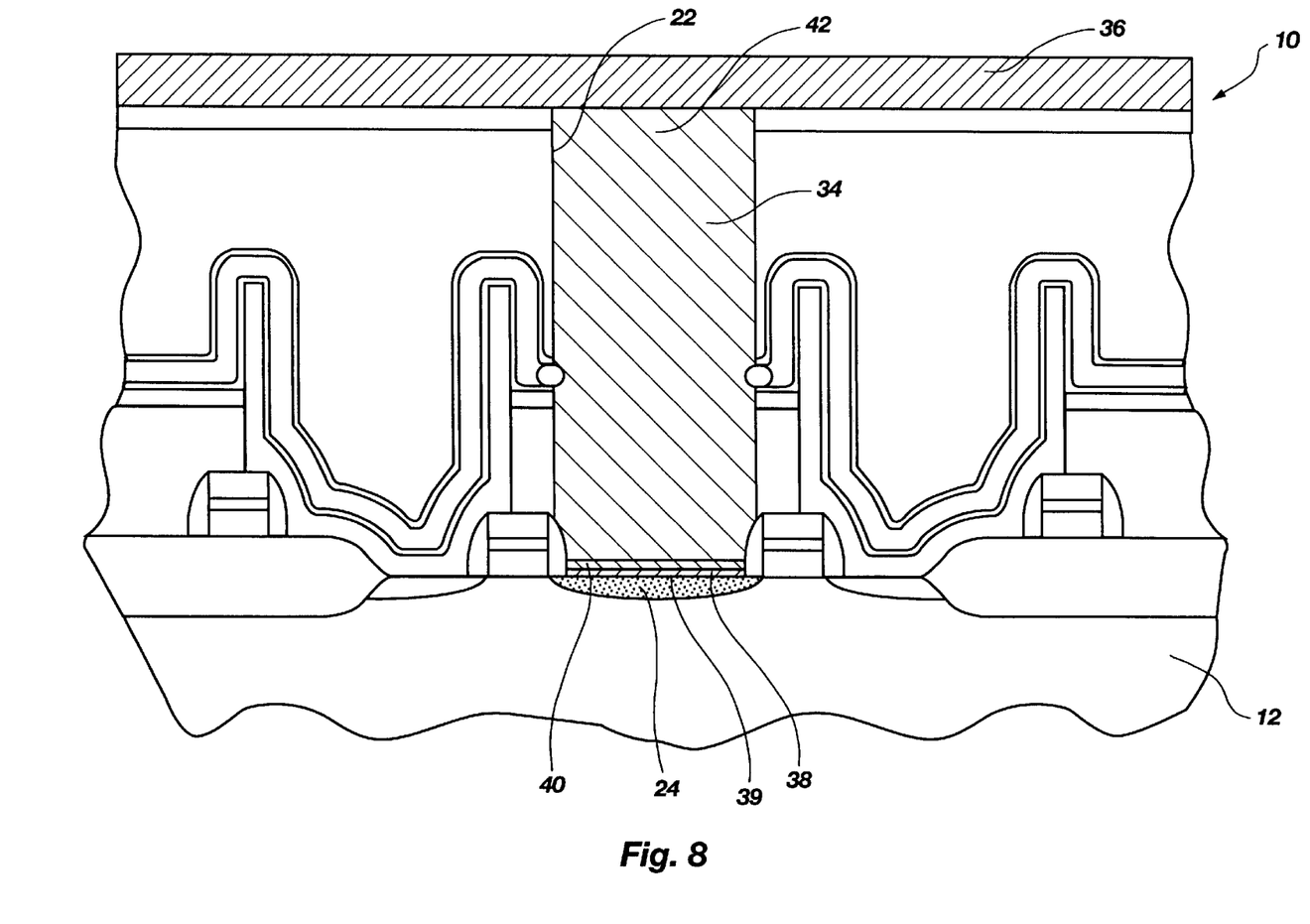

Referring to FIG. 8, if aluminum layer 42 is removed from active surface 11, a bit line 36 comprised of an electrically conductive material, such as a metal (e.g., tungsten, titanium, aluminum), an electrically conductive polymer, or polysilicon, may be fabricated above stacked capacitor structure 20 and in electrical contact with aluminum interconnect 34. Known metal layer fabrication processes, such as PVD or CVD processes, may be employed to deposit a layer of metal from which bit line 36 is to be defined by known patterning techniques, such as mask and etch processes.

Additional structures and layers may then be fabricated over the active surface 11 of semiconductor device structure 10 by known processes.

The semiconductor device structure 10 (see FIG. 1) of the present invention may have increased speed and lower power consumption than many state of the art semiconductor devices due to the use of aluminum, which has a low resistivity, in interconnects 34 and due to the salicide selective contact 38 and the buried metal diffusion layer 39, each of which may reduce contact resistance.

In addition, the aluminum interconnects 34 of semiconductor device structure 10 of the present invention may also facilitate further increases in the density of semiconductor device structures due to the low resistivity of aluminum and, thus, the potentially thinner interconnects 34 that may be fabricated through the stacked capacitor structures 20 of such semiconductor devices.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A method of fabricating a semiconductor device structure, comprising:

providing a semiconductor substrate including at least one active device region;

forming a stacked capacitor structure above said semiconductor substrate;

forming a trench through said stacked capacitor structure to expose said at least one active device region;

forming a buried metal diffusion layer within said trench; and disposing aluminum over at least said stacked capacitor structure and within said trench, over said buried metal diffusion layer.

2. The method of claim 1, wherein said forming said buried metal diffusion layer includes forming a metal silicide layer over said at least one active device region.

3. The method of claim 2, wherein said forming said metal silicide layer includes selectively depositing said metal silicide over said at least one active device region.

4. The method of claim 2, wherein said forming said buried metal diffusion layer further includes depositing a layer of metal or metal nitride over said at least one active device region and annealing said buried metal diffusion layer to said metal or metal nitride layer.

5. The method of claim 2, wherein said forming said buried metal diffusion layer further includes forming a metal nitride layer adjacent said metal silicide layer.

6. The method of claim 2, wherein said forming said buried metal diffusion layer further includes depositing aluminum within said trench and in electrical communication with said at least one active device region.

7. The method of claim 1, further comprising forming at least one bit line above said semiconductor substrate.

8. The method of claim 7, wherein said forming said at least one bit line further includes patterning said layer of aluminum.

9. The method of claim 7, wherein said forming said at least one bit line includes chemical-mechanical planarizing a surface of the semiconductor device structure.

10. The method of claim 9, wherein said forming said at least one bit line further includes depositing a layer of a material in electrical communication with said buried metal diffusion layer.

11. The method of claim 10, wherein said forming said at least one bit line further includes patterning said layer of said material.

* * * * *

UNITED STATES PATENT AND TRADEMARK OFFICE
CERTIFICATE OF CORRECTION

PATENT NO.    : 6,165,863
DATED         : December 26, 2000
INVENTOR(S)   : Lee et al.

It is certified that error appears in the above-identified patent and that said Letters Patent is hereby corrected as shown below:

Column 6,
Line 61, change "5,525,518" to -- 5,252,518 --

Signed and Sealed this

Fourth Day of November, 2003

JAMES E. ROGAN
*Director of the United States Patent and Trademark Office*